United States Patent
Bennett et al.

[11] Patent Number: 4,780,662
[45] Date of Patent: Oct. 25, 1988

[54] DETERMINING ECCENTRICITY OF INSULATED WIRE

[75] Inventors: Allan I. Bennett, Murrysville; Dean C. Westervelt, Bullskin Township, Fayette County, both of Pa.

[73] Assignee: Westinghouse Electric Corp., Pittsburgh, Pa.

[21] Appl. No.: 26,242

[22] Filed: Mar. 16, 1987

[51] Int. Cl.$^4$ .............................................. G01R 27/26
[52] U.S. Cl. .................................. 324/61 R; 324/61 P
[58] Field of Search ................... 324/61 R, 519, 61 P, 324/543, 544, 551, 554

[56] References Cited

U.S. PATENT DOCUMENTS 2,604,512  7/1952  Bacon et al. ..................... 324/61 R
3,748,577  7/1973  Jones, Jr. ........................ 324/61 R Primary Examiner—Reinhard J. Eisenzopf
Assistant Examiner—Anthony Miele
Attorney, Agent, or Firm—A. Mich, Jr.

[57] ABSTRACT

Disclosed is a method of determining the eccentricity of the insulation on a round wire without making electrical contact with the wire. The insulated wire is passed between two pairs of opposing electrodes, pair A-C and pair B-D, positioned at a known distance from the insulated wire and spaced apart azimuthally at a known angle. Known, out of phase, alternating voltages are applied to each pair of electrodes. Signals are generated from the four electrodes that are proportional to (1) $v_A - v_B + v_C - v_D$ and (2) $-v_A - v_B + v_C + v_D$, where $v_A$, $v_B$, $v_C$, and $v_D$ are the voltages on electrodes A, B, C, and D, respectively. From those signals the eccentricity of the insulation on the wire can be determined by $$E = \frac{1 + |q|/2}{1 - |q|/2}$$

where $|q|$ is the magnitude of $$\frac{V_A - V_B + V_C - V_D}{-V_A - V_B + V_C + V_D}.$$

The direction of the eccentricity can be determined from the difference in phase between the two signals. Also disclosed is an apparatus for determining the maximum ratio of insulation thickness on one side of a round insulated wire to the insulation thickness on the opposite side of the insulated wire. The apparatus comprises two pairs of opposing electrodes, pair A-C and pair B-D, spaced radially apart and positioned around the insulated wire, means for applying known, out of phase, alternating voltages from independent sources to each pair of electrodes, and means for generating signals from said electrodes that are proportional to (1) $v_A - v_B + v_C - v_D$ and (2) $-v_A - v_B + v_C + v_D$.

17 Claims, 3 Drawing Sheets

DETERMINING ECCENTRICITY OF INSULATED WIRE

BACKGROUND OF THE INVENTION

In manufacturing magnet wire, a bare wire is passed through an enamel bath, up through a die to remove excess enamel, then through an oven which bakes the enamel onto the wire. Because the layer of enamel on the wire is so thin it is very important that the wire be centered within the enamel coating that surrounds it. That is, while both the wire and the insulation may have circular outside circumferences, the center of the wire may not coincide with the center of the insulation. As a result, the insulation on one side of the wire may be quite thick while the insulation on the opposite side may be inadequately thin. The ratio of the thickness of the insulation on one side of the wire to the thickness of the insulation on the opposite side is known as the "eccentricity." An eccentricity of one means that the thickness is equal on both sides of the wire while an eccentricity of zero or infinity would mean that all of the insulation is on only one side of the wire. A lack of concentricity is particularly a problem when the wire is first started moving up through the die, but even after the wire has been coated properly for some time the eccentricity of wire being coated can change.

Efforts have been made to measure the eccentricity of the wire by determining the electrical properties of the insulation on several sides of the wire. This can be done, for example, by placing an electrode over the insulation and making an electrical contact to the wire itself. However, such techniques are impractical when the wire is several miles long or the wire is close to other electrical apparatus, which can induce interfering signals in the wire. Of course, the insulation can be cut through to make an electrical contact with the wire, but then the insulation would have to be repaired, which could result in non-uniform insulation or slowing or stopping the coating operation. Another procedure, presently being used, is to cut small pieces of the wire out at occasional intervals, imbed the pieces in plastic, and examine the ends of the pieces under a microscope to visually determine the eccentricity. This technique is not only time consuming, but also means that longer lengths of wire cannot be produced, and, if eccentricity measurements at intermediate locations are required, that the coating operation must be stopped to remove sections of the wire.

SUMMARY OF THE INVENTION

We have discovered a method and apparatus for determining the eccentricity of an insulated round wire which does not require any electrical connection to the wire itself. That is, in the method and apparatus of this invention, the insulation on the wire need not be cut through in order to make an electrical contact with the bare wire. Nor is it necessary, in the practice of this invention, to rotate, bend, or otherwise manipulate the wire, which may fatigue the wire or damage the insulation. Another important advantage of the method and apparatus of this invention is that the eccentricity of the wire can be monitored continuously so that large quantities of wire having an unacceptable eccentricity are not produced before the lack of concentricity is detected; this can significantly reduce the amount of scrap wire that is produced. Finally, the method and apparatus of this invention involves only a small localized section of the wire at a time, and thus is not susceptible to inaccuracies due to inductively or capacitively coupled electrical interference from other electrical apparatus in the vicinity.

DESCRIPTION OF THE INVENTION

We have discovered that the eccentricity of the wire insulation can be determined by measuring the capacitance, which is inversely proportional to the insulation thickness, of the insulation on opposite sides of the wire. While it would seem to be impossible to accomplish this without making an electrical connection to the wire itself, we have found that by placing four equally-sized electrodes against the outer insulation surface, spaced angularly 90° apart around the wire, and applying suitable electrical energization to these electrodes, it is possible from measurements of the resulting electrode voltages to determine the insulation eccentricity without having to make electrical connection to the wire itself. By measuring the phase relations of the voltages, the direction of the eccentricity can also be determined. The invention will be more fully understood following a description of the drawings and of the equations which describe the principles by which the invention operates. Once the principles of the invention are understood, the circuit analysis and calculations necessary to obtain the eccentricity and the direction of the eccentricity can be performed by an electrical engineer having ordinary skill in the art.

Figure 1:
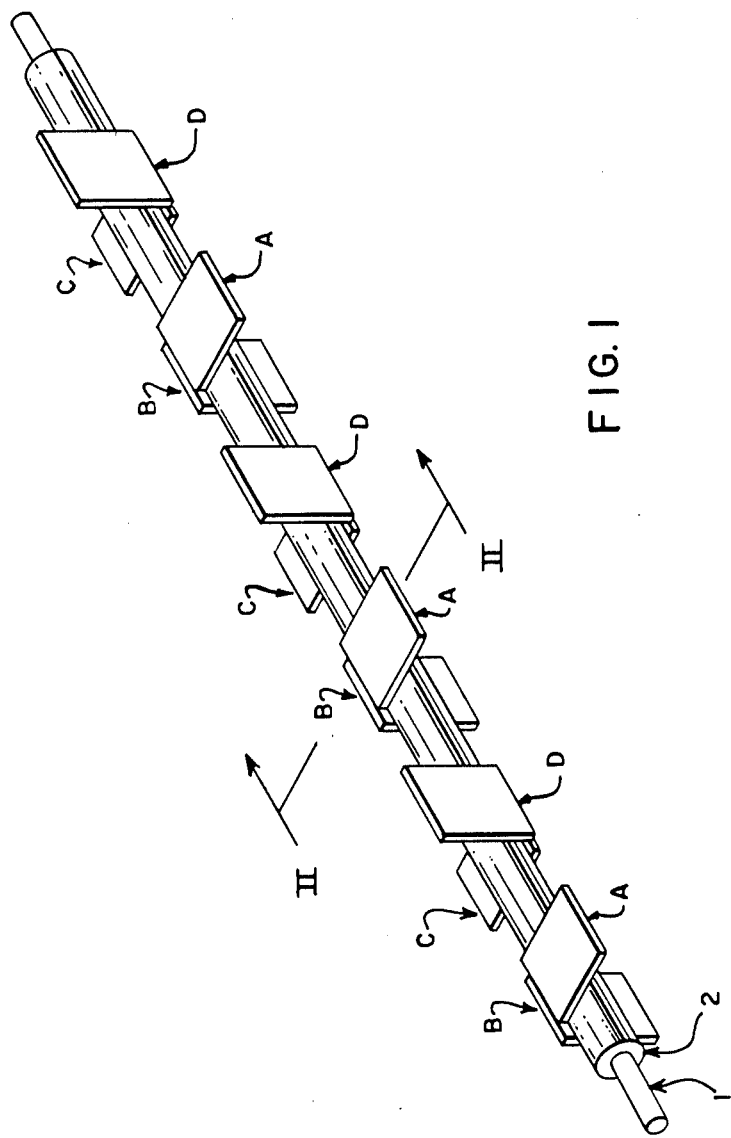
FIG. 1 is an isometric view partially in section illustrating a certain presently preferred positioning of electrodes around an insulated wire according to this invention.

FIG. 1 shows a preferred arrangement of electrodes around an insulated wire. In FIG. 1, a wire 1 is covered with insulation 2 and the insulated wire moves in the direction of its length past electrodes A, B, C, and D. Each electrode touches the enamel along a line parallel to the wire axis, and the four lines are 90° apart circumferentially around the wire. Electrodes A are electrically connected to form a single electrode which is opposed by electrodes C, also forming a single electrode on the opposite side of the wire. Similarly, electrodes D form a single electrode opposed by electrodes B on the opposite side of the wire. Thus, electrodes A and C form one pair of electrodes, and electrodes B and D form a second pair of electrodes.

Figure 3:
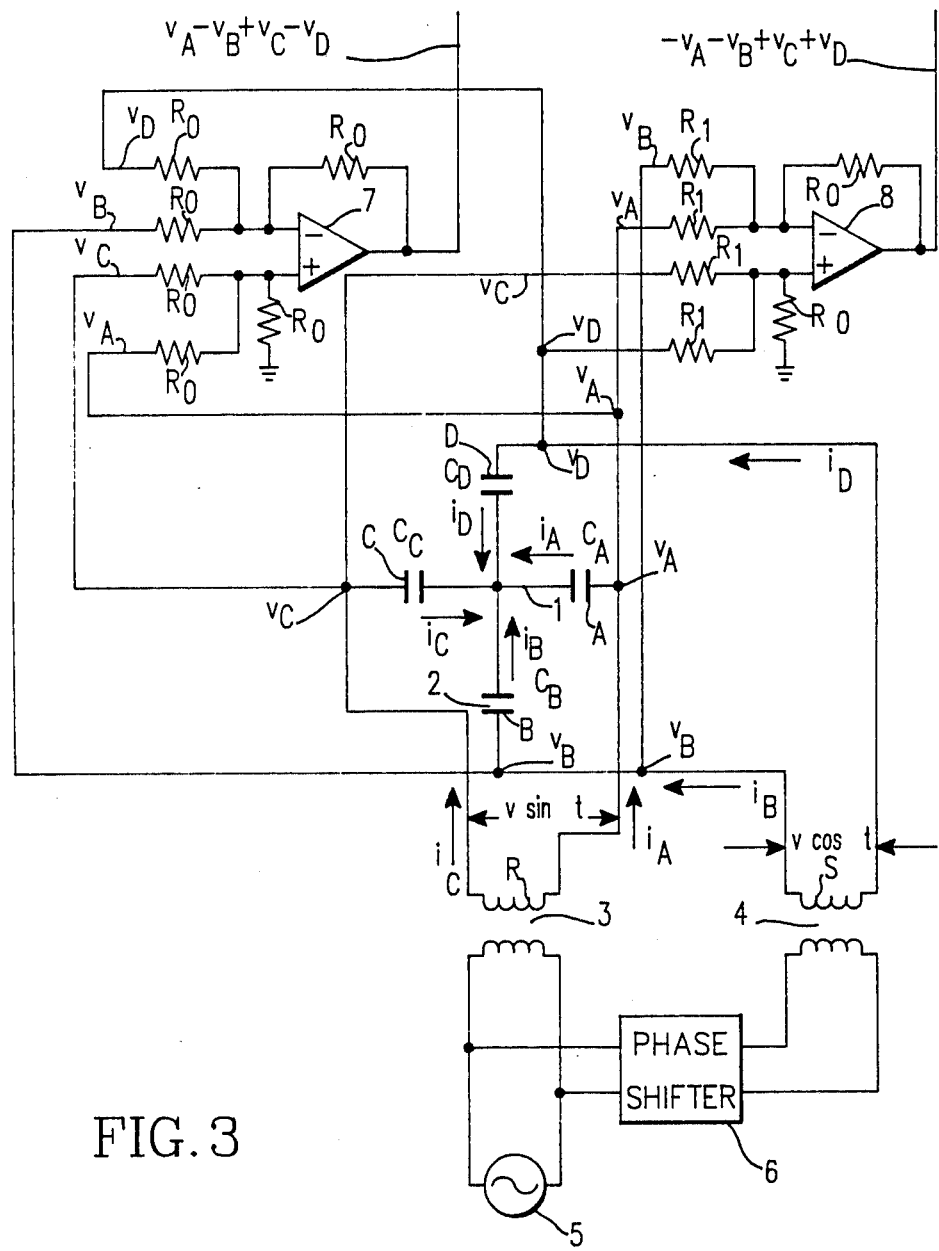
FIG. 3 is a certain presently preferred embodiment of a circuit diagram which further illustrates the method and apparatus of this invention.

Using conventional electrical phasor notation, the voltages on electrode A, B, C, and D, are defined as $v_A$, $v_B$, $v_C$, $v_D$, respectively, and the voltage on the wire is defined as $v_O$. The currents in the leads to the electrodes are given by the following equations:

$$i_A = j\omega C_A(v_A - v_O) \qquad (1)$$
$$i_B = j\omega C_B(v_B - v_O)$$
$$i_C = j\omega C_C(v_C - v_O)$$
$$i_D = j\omega C_D(v_D - v_O)$$

where $j^2 = -1$ and $C_A$, $C_B$, $C_C$, and $C_D$ are the electrical capacitances between electrodes A, B, C, and D, respectively, and the wire. These currents are illustrated in FIG. 3. (The assumption is made that the capacitive current from each electrode to any location other than the wire is negligible compared to that to the wire. This assumption appears to be experimentally justified; if necessary, the assumed condition can be obtained by suitably actively-driven guard electrodes).

Figure 2:
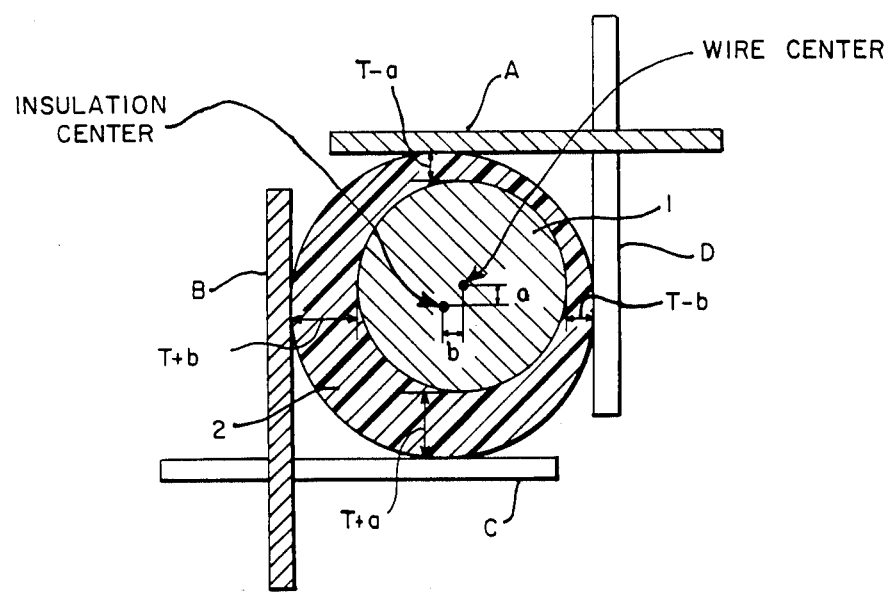
FIG. 2 is an end view in section illustrating the geometry of the electrode-to-wire capacitances used in the method of this invention.

The capacitances from the electrodes to the wire are shown in some detail in FIG. 2. The capacitance varies with the insulation thickness at the line of contact, increasing as the thickness decreases. If both electrodes of this capacitance, i.e., the electrode and the wire, were parallel planes, and the intervening space were filled with enamel, then the capacitance would vary as a reciprocal of the enamel thickness. In the design shown in FIG. 1, however, this is not strictly true, but this type of relation is nevertheless a good first approximation. If the average thickness of the insulation is T, and the x and y coordinates of the center of the wire relative to those of the center of the outer surface of the insulation are a and b, then, as a close approximation, the insulation thicknesses at electrodes A, B, C, and D are T−a, T+b, T+a, T−b, respectively. The capacitances $C_A$, $C_B$, $C_C$, and $C_D$ will then be approximately:

$$C_A = \frac{k}{T-a} \tag{2A}$$

$$C_B = \frac{k}{T+b} \tag{2B}$$

$$C_C = \frac{k}{T+a} \tag{2C}$$

$$C_D = \frac{k}{T-b} \tag{2D}$$

where k is a constant of proportionality which need not be determined.

If voltages are now applied to the electrode system by the circuit of FIG. 3, it necessarily follows that the currents in FIG. 3 obey the following equations:

$$i_A = -i_C = ji_B = -ji_D \tag{3}$$

FIG. 3 shows a type of circuit for applying voltage to the electrodes which automatically ensures that $i_C = -i_A$ and that $i_B = -i_D$, since both pairs of electrodes are driven from isolated transformer secondaries of transformers 3 and 4. If both primaries are driven from the same oscillator 5 but the phase of one is shifted 90° relative to the other by phase shifter 6, then the phase relations of equation (3) are obtained. Feedback techniques can be used, if desired, to make all four current magnitudes precisely equal and 90° apart in phase.

From the previous equations given it follows that:

$$i_A = \frac{j\omega k(v_A - v_O)}{T - a} \tag{4A}$$

$$i_B = \frac{j\omega k(v_B - v_O)}{T + b} = -ji_A \tag{4B}$$

$$i_C = \frac{j\omega k(v_C - v_O)}{T + a} = -i_A \tag{4C}$$

$$i_D = \frac{j\omega k(v_D - v_O)}{T - b} = ji_A \tag{4D}$$

-continued $$v_A - v_O = \frac{i_A}{k\omega}(-j)(T - a) \tag{5A}$$

$$v_B - v_O = \frac{i_A}{k\omega}(-1)(T + b) \tag{5B}$$

$$v_C - v_O = \frac{i_A}{k\omega}(j)(T + a) \tag{5C}$$

$$v_D - v_O = \frac{i_A}{k\omega}(T - b) \tag{5D}$$

$$\frac{b}{T} = \frac{v_B + v_D - 2v_O}{v_B - v_D} = \beta \tag{6}$$

$$\frac{a}{T} = \frac{v_C + v_A - 2v_O}{v_C - v_A} = \alpha \tag{7}$$

Since the distance R between the center of the wire and the center of the enamel outer surface is given by $r = (a^2 + b^2)^{\frac{1}{2}}$ it follows that the maximum insulation thickness is T+r while the minimum is T−r. The eccentricity E (the ratio of maximum to minimum insulation thickness) is defined by $E = (T+r)/(T-r)$ and is given by the equation:

$$E = \frac{T + r}{T - r} = \frac{1 + \frac{r}{T}}{1 - \frac{r}{T}} = \frac{1 + (\alpha^2 + \beta^2)^{\frac{1}{2}}}{1 - (\alpha^2 + \beta^2)^{\frac{1}{2}}} \tag{8}$$

Equations (6), (7), and (8) directly express the eccentricity as a function of the five voltages. The voltages $v_A$, $v_B$, $v_C$, and $v_D$ at the four electrodes are directly accessible for measurement. The measurement of these voltages can be made electrically in a variety of ways. The voltage difference between electrodes A and B or C and D (i.e., $v_A - v_B$ or $v_C - v_d$) can be measured, or the sum of both of these differences can be measured (i.e., $v_A - v_B + v_C - v_D$). Also, the voltages can be measured with reference to any arbitrary point (e.g., ground or one of the electrodes). Alternatively, no measurement of the voltages need be made at all. Rather, a signal can be generated that varies in proportion to (1) $v_A - v_B + v_C - v_C$ and (2) $-v_A - v_B + v_C + v_D$. FIG. 3 shows circuits for generating these signals. In FIG. 3, current from the four electrodes passes through identical resistors $R_O$, and is parallel through operational amplifier 3 and another resistor $R_O$. The resulting voltage is $v_A - v_B + v_C - v_D$. Similarly, current from the four electrodes passes through identical resistors $R_1$, then is parallel through operational amplifier 4 and another resistor $R_1$. The resulting voltage is $-v_A - v_B + v_C + v_D$.

Another way to measure $v_A - v_B + v_C - v_D$ (the numerator of equation (11)), is to use the center taps R and S of the secondaries of the electrode drive transformers 3 and 4 in FIG. 3. Since the voltage at R is $\frac{1}{2}(v_A + v_C)$ while that at S is $\frac{1}{2}(v_B + v_D)$ the voltage difference between R and S is $\frac{1}{2}(v_A - v_B + v_C - v_D)$.

As earlier described, the voltage $v_O$ at the wire is not readily available. It is not, however, necessary to know $v_O$ in order to calculate the eccentricity. From equations (5) we can write the equation:

$$(v_A - v_O) - (v_B - v_O) + (v_C - v_O) - (v_D - v_O) = \tag{9}$$

$$v_A - v_B + v_C - v_D =$$

-continued $$\frac{i_A}{k\omega}(-jT + ja + jT + ja + T + b - T + b) = \frac{2i_A}{kw}(b + ja)$$

$$-(v_A - v_O) - (v_B - v_O) + (v_C - v_O) + (v_D - v_O) = \quad (10)$$

$$-v_A - v_B + v_C + v_D =$$

$$\frac{i_A}{k\omega}(+jT - ja + jT + ja + T + b + T - b) = \frac{2i_A}{kw}(1 + j)T \quad 10$$

By division of the first equation by the second we have:

$$\frac{v_A - v_B + v_C - v_D}{-v_A - v_B + v_C + v_D} = \frac{b + ja}{(1 + j)T} = q \quad (11)$$

The quantity q is a complex number or phasor. Its magnitude, $(a^2+b^2)^{\frac{1}{2}}/(\sqrt{2}T)$ or $2^{\frac{1}{2}}$ (r/T) allows the eccentricity E to be calculated from equation (8) with no need to measure $v_O$ since the latter does not appear in equation (11), nor do k, $i_A$, or $\omega$.

Eccentricity may be calculated by the following equation (12):

$$E = \frac{1 + |q|/2}{1 - |q|/2} \quad (12)$$

where $|q|$ is the magnitude of $$\frac{v_A - v_B + v_C - v_D}{-v_A - v_B + v_C + v_D}.$$

From the phase of q relative to the four measured voltages it is also possible, if desired, to calculate the direction in which the wire center is displaced from the center of the outer enamel surface relative to electrode positions. More specifically, the phase of q is the angle by which the voltage $v_A - v_B + v_C - v_D$ leads the voltage $-v_A - v_B + v_C + v_D$. If this angle is $\phi$, then the angle of the vector displacement of the center of the wire relative to the center of th circumference of the insulation, measured counterclockwise from the line from the center of the insulation circumference to electrode A in FIG. 3, is $\phi - 45°$.

It should also be noted that equation (10) allows the calculation of average enamel thickness T from the measured voltages if k, $i_A$, and $\omega$ are known, using conventional circuit analysis and the dielectric constant of the insulation. The constant k, which need not be known for determination of the eccentricity but does have to be known for determination of enamel thickness from equation (10), is the product of the thickness of the insulation at a point of contact with one of the electrodes and the capacitance from that electrode to the wire, as expressed in equations (2). The value of k could be determined either by calculating the capacitance for typical insulation thicknesses by conventional field-plotting techniques, or by measurement of the capacitance for known insulation thicknesses.

The apparatus and method of this invention can be applied to any insulated conductor (but not to insulation under a shield on a conductor). The insulation may be of any type, including solvent based enamels, 100% solids insulation, UV cured resins or various other polymeric types of coatings. It can also be used on wrapped insulation, but lack of eccentricity is not particularly a problem with that type of insulation. It is particularly useful with enamel insulations because enamel insulations are very thin and therefore a lack of concentricity can easily result in an inadequate insulation on the wire. The wire can be of any conductive material including copper, aluminum, and other metals, and can be of any size. The invention is most useful for sizes greater than about 40 mils as most of the difficulties with eccentricity occur with larger size wire. The wire is preferably round wire, but the invention could also be applied to rectangular wire.

While the number of electrodes is preferably four there is no reason, in principle, why additional pairs of electrodes cannot be used. Also, while it is preferable to have the electrodes contact the insulation, the invention in principle can be applied to electrodes that are spaced away from the insulation, which may be necessary when the insulation is not yet completely cured or solid. The most accurate measurements are made when the electrodes are spaced angularly or azimuthally 90° apart, but other spacings can also be used, provided the angle between the electrodes is known and is taken into consideration. The voltages applied to the two pairs of electrodes are preferably the same in magnitude since this simplifies calculations, but other ratios of voltages can also be used. Similarly, calculations are simplest when the phase difference between the voltages applied to the two pairs of electrodes is 90°, but other phase differences can be used as long as the voltages are at least somewhat out of phase. The currents applied to the electrodes must be alternating. Although in principle any frequency is suitable, the preferred frequency range is about 60 to about 2000 cycles per second; lower frequencies increase the capacitive reactance and make accurate measurements of the voltage more difficult, and higher frequencies offer no additional benefit.

The measurement of eccentricity and angle of eccentricity provided by the method and apparatus of the invention can be used to automatically adjust and correct the eccentricity of the insulation, or adjustments can be made by hand using the information. Analysis of the measured voltages to provide the eccentricity and direction of eccentricity can be performed using a computer using conventional circuit analysis well known to those skilled in the art.

We claim:

1. A method of determining the eccentricity of the insulation on a wire, comprising
   (A) passing said insulated wire between two pairs of opposing electrodes, pair A-C and pair B-D, positioned at a known distance from said insulated wire and spaced apart azimuthally at a known angle;
   (B) applying an alternating voltage between the two electrodes of each pair, said voltages being known and out of phase by a known phase angle;
   (C) generating signals from said electrodes that are proportional to (1) $v_A - v_B + v_C - v_D$ and (2) $-v_A - v_B + v_C + v_D$, where $v_A$, $v_B$, $v_C$, $v_D$ are the voltages on electrodes A, B, C, and D, respectively; and
   (D) determining said eccentricity from said known distance, said known angle, said known applied voltages, said known phase angle, and the information generated in part (C)
   wherein step (D) is performed using the equation: eccentricity, $$E = \frac{1 + |q|/2}{1 - |q|/2}$$

where $|q|$ is the magnitude of $$\frac{v_A - v_B + v_C - v_D}{-v_A - v_B + v_C + v_D}.$$

2. A method according to claim 1 wherein said electrodes contact said insulation.

3. A method according to claim 1 wherein said pairs of electrodes are spaced apart azimuthally at an angle of 90°.

4. A method according to claim 1 wherein said applied alternating voltages are 90° out of phase.

5. A method according to claim 1 wherein said alternating voltages have the same frequency between 60 and 2000 cycles/second.

6. A method according to claim 1 wherein said pairs of electrodes are spaced apart azimuthally at an angle of 90°, said applied alternating voltages are 90° out of phase, and said alternating voltages have the same frequency between 60 and 2000 cycles/second.

7. A method according to claim 6 wherein said direction of said eccentricity is determined by the phase difference between the numerator and the denominator in the equation that defines E.

8. A method according to claim 1 including the steps of determining the phase difference between said applied voltage and said resultant voltage, and determining the direction of any eccentricity from said phase difference.

9. A method of determining the eccentricity of a round insulated wire, comprising
  (A) passing said insulated wire between two pairs of opposing electrodes, pair A-C and pair B-D, each electrode being in contact with said insulation and spaced 90° from electrodes in the other pair;
  (B) applying the same voltage v, but 90° out of phase, from independent sources, to each pair of electrodes;
  (C) generating a signal that is proportional to $$q = \frac{v_A - v_B + v_C - v_D}{-v_A - v_B + v_C + v_D}$$

where $v_A$, $v_B$, $v_C$, and $v_D$ are the voltages on electrodes A, B, C, and D, respectively; and
  (D) calculating said eccentricity, E, as $$E = \frac{1 + \frac{|q|}{2}}{1 - \frac{|q|}{2}}.$$

10. A method according to claim 9 including determining the phase of q.

11. An apparatus for determining the maximum ratio of insulation thickness on one side of a round insulated wire to insulation thickness on the opposite side of said insulated wire, comprising
  (A) two pairs of opposing electrodes, pair A-C and pair B-D, spaced azimuthally apart and positioned around said insulated wire;
  (B) means for applying alternating voltages from independent sources to each pair of said electrodes, said voltages having a known ratio, said voltages being out of phase by a known angle;
  (C) means for generating signals from said electrodes that are proportional to (1) $v_A - v_B + v_C - v_D$ and (2) $-v_A - v_B + v_C + v_D$, where $v_A$, $v_B$, $v_C$, and $v_D$ are the voltages on electrodes A, B, C, and D, respectively; and
  (D) means for calculating said eccentricity, E, as $$E = \frac{1 + \frac{|q|}{2}}{1 - \frac{|q|}{2}}$$

where $|q|$ is the magnitude of $$\frac{v_A - v_B + v_C - v_D}{-v_A - v_B + v_C + v_D}.$$

12. Apparatus according to claim 11 wherein said electrodes contact said insulation.

13. Apparatus according to claim 11 wherein said electrodes are spaced 90° apart.

14. Apparatus according to claim 11 wherein said means for applying alternating voltages is the secondary coils of two transformers.

15. Apparatus according to claim 14 wherein said means for measuring said sum is a voltmeter connected to the center points of said secondary coils.

16. Apparatus according to claim 11 wherein said ratio of voltage is 1.

17. Apparatus according to claim 11 wherein said known angle is 90°.

* * * * *